(12) United States Patent
Tailliet

(10) Patent No.: US 8,405,942 B2
(45) Date of Patent: Mar. 26, 2013

(54) INTEGRATED CIRCUIT PROVIDED WITH A PROTECTION AGAINST ELECTROSTATIC DISCHARGES

(75) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 229 days.

(21) Appl. No.: 13/021,904

(22) Filed: Feb. 7, 2011

(65) Prior Publication Data

US 2011/0194219 A1 Aug. 11, 2011

(30) Foreign Application Priority Data

Feb. 8, 2010 (FR) ...................................... 10 50860

(51) Int. Cl.
*H02H 9/00* (2006.01)
(52) U.S. Cl. ......................................................... 361/56
(58) Field of Classification Search ...................... 361/56
See application file for complete search history.

(56) References Cited

U.S. PATENT DOCUMENTS

| | | | |
|---|---|---|---|
| 5,239,440 A | | 8/1993 | Merrill |
| 5,671,111 A * | | 9/1997 | Chen ................................ 361/56 |
| 6,424,510 B1 * | | 7/2002 | Ajit et al. ......................... 361/59 |
| 6,690,555 B1 | | 2/2004 | Pasqualini |
| 7,580,233 B2 * | | 8/2009 | Davis ............................... 361/56 |
| 2003/0071662 A1 | | 4/2003 | Kwong |
| 2007/0091524 A1 * | | 4/2007 | Davis ............................... 361/56 |
| 2007/0183104 A1 * | | 8/2007 | Tseng .............................. 361/56 |
| 2008/0043389 A1 * | | 2/2008 | Fehle et al. ...................... 361/56 |
| 2008/0123228 A1 | | 5/2008 | Hung |
| 2009/0174973 A1 | | 7/2009 | Khazhinsky et al. |
| 2010/0254051 A1 * | | 10/2010 | Jeon et al. ........................ 361/56 |
| 2011/0255200 A1 * | | 10/2011 | Tsai et al. ........................ 361/56 |

OTHER PUBLICATIONS

French Search Report dated Aug. 18, 2010 from corresponding French Application No. 10/50860.

* cited by examiner

*Primary Examiner* — Ronald W Leja

(74) *Attorney, Agent, or Firm* — Wolf, Greenfield & Sacks, P.C.

(57) ABSTRACT

An integrated circuit protected against electrostatic discharges, having output pads coupled to amplification stages, each stage including, between first and second power supply rails, a P-channel MOS power transistor in series with an N-channel MOS power transistor, this integrated circuit further including protection circuitry for simultaneously turning on the two transistors when a positive overvoltage occurs between the first and second power supply rails.

4 Claims, 4 Drawing Sheets

US 8,405,942 B2

INTEGRATED CIRCUIT PROVIDED WITH A PROTECTION AGAINST ELECTROSTATIC DISCHARGES

CROSS REFERENCE TO RELATED APPLICATIONS

This application claims the priority benefit of French patent application number 10/50860, filed on Feb. 8, 2010, entitled "Integrated Circuit Provided with a Protection Against Electrostatic Discharges," which is hereby incorporated by reference to the maximum extent allowable by law.

BACKGROUND OF THE INVENTION

1. Field of the Invention

The present invention relates to the protection of integrated circuits against electrostatic discharges.

2. Discussion of the Related Art

An integrated circuit comprises metal pads intended to provide connections to the outside. Some of the pads are capable of receiving power supply voltages. The other pads are capable of receiving and/or of providing input/output signals. Power supply rails, connected to the supply pads, are generally provided all around the circuit to power its different components. Generally, an insulating layer covers the circuit, only leaving access to the metal pads.

Such a circuit generally receives and/or delivers signals of low voltage level (for example, from 1 to 5 V) and of low current intensity (for example, from 1 µA to 10 mA), and may be damaged when overvoltages or overintensities occur between pads of the circuit.

It is thus provided to associate a protection structure with each pad. The protection structure should be able to rapidly drain off significant currents, that appear when an electrostatic discharge occurs on an input/output pad ("pad", for simplification) or on a pad connected to a power supply rail ("rail", for simplification).

FIG. 1 shows an example of a protection structure 1 associated with an integrated circuit input/output pad 3. A diode 5 is forward connected between pad 3 and a high power supply rail $V_{DD}$. A diode 7 is reverse-connected between pad 3 and a low power supply rail $V_{SS}$. A MOS transistor 9, used as a switch, is connected between high and low power supply rails $V_{DD}$ and $V_{SS}$. An overvoltage detection circuit 11, connected in parallel with MOS transistor 9, provides a trigger signal to this transistor. MOS transistor 9 comprises a parasitic diode 10, forward connected between rail $V_{SS}$ and rail $V_{DD}$.

In normal operation, when the chip is powered, the signals on pad 3 and rails $V_{DD}$ and $V_{SS}$ are such that diodes 5 and 7 conduct no current and detection circuit 11 makes MOS transistor 9 non-conductive.

In case of a positive overvoltage between rails $V_{DD}$ and $V_{SS}$, circuit 11 turns on transistor 9, which enables to remove the overvoltage.

In case of a negative overvoltage between rails $V_{DD}$ and $V_{SS}$, parasitic diode 10 of transistor 9 becomes conductive and the overvoltage is removed.

In case of a positive overvoltage between pad 3 and high power supply rail $V_{DD}$, diode 5 becomes conductive and the overvoltage is removed.

In case of a negative overvoltage between pad 3 and rail $V_{DD}$, circuit 11 turns on transistor 9 and the overvoltage is removed through transistor 9 and diode 7.

In case of a positive overvoltage between pad 3 and rail $V_{SS}$, diode 5 becomes conductive and the positive overvoltage is transferred onto rail $V_{DD}$, which corresponds to the above case of a positive overvoltage between rails $V_{DD}$ and $V_{SS}$.

In case of a negative overvoltage between pad 3 and rail $V_{SS}$, diode 7 becomes conductive and the overvoltage is removed.

In case of a positive or negative overvoltage between two input/output pads 3, diodes 5 or 7 associated with the concerned pads become conductive, and the overvoltage is transferred onto high and low power supply rails $V_{DD}$ and $V_{SS}$. This corresponds to one of the above overvoltage cases.

FIG. 2 partly shows the diagram of FIG. 1 and shows in further detail an example of a possible embodiment of a circuit 11 for detecting a positive overvoltage between rails $V_{DD}$ and $V_{SS}$, and for controlling protection transistor 9. An edge detector, formed of a resistor 21 in series with a capacitor 23, is connected between power supply rails $V_{DD}$ and $V_{SS}$. Node M between resistor 21 and capacitor 23 is connected to the gate of a P-channel MOS transistor 25 having its source connected to rail $V_{DD}$ and having its drain connected to rail $V_{SS}$ via a resistor 27. Node N between the drain of transistor 25 and resistor 27 is connected to the gate of transistor 9. An assembly 29 of diodes in series is forward-connected between node M and rail $V_{SS}$. In this example, assembly 29 comprises four diodes in series.

In normal operation, when the circuit is powered, node M is in a high state. P-channel MOS transistor 25 thus conducts no current. Thus, gate node N of transistor 9 is in a low state, and protection transistor 9 is maintained off. When the potential difference between rails $V_{DD}$ and $V_{SS}$ increases, the voltage of node M also increases. When the voltage of node M reaches a given threshold, diode assembly 29 becomes conductive. In this example, if each diode has a 0.6-V threshold voltage, assembly 29 becomes conductive when the voltage of node M exceeds 2.4 V. This results in a voltage drop at node M, which turns on P-channel MOS transistor 25. Thus, gate node N of protection transistor 9 switches to a high state, that is, substantially to the same positive voltage as rail $V_{DD}$. Transistor 9 thus becomes conductive and the overvoltage is removed.

When the integrated circuit is not powered, node M is in a low state. Since transistor 25 is not powered, drain node N of this transistor is in an undetermined state. If an abrupt positive overvoltage (fast voltage rise) occurs between rails $V_{DD}$ and $V_{SS}$, node M remains in a low state. Transistor 25 thus becomes conductive and node N switches to a high state. Thus, protection transistor 9 is made conductive and the overvoltage is removed.

A disadvantage of the protection structure of FIGS. 1 and 2 lies in the fact that, to be able to drain off the currents induced by electrostatic discharges, diodes 5 and 7 and transistor 9 should have a large surface area (for example, a 200-µm junction perimeter per diode and a channel width of several tens of millimeters for the transistor). As a result, a significant silicon surface area is exclusively dedicated to the protection against electrostatic discharges, to the detriment of the other circuit components. Further, due to its large size, MOS transistor 9, in the off state, is crossed by significant leakage currents, which increases the circuit power consumption and the stray capacitance between rails $V_{DD}$ and $V_{SS}$.

SUMMARY OF THE INVENTION

An object at least one embodiment of the present invention is to provide an integrated circuit provided with a protection against electrostatic discharges, where this protection does not increase the silicon surface area taken up by the same circuit when unprotected or only slightly does so.

An object of an embodiment of the present invention is to provide such a protection which does not disturb the proper operation of the circuit in normal conditions of use.

An object of an embodiment of the present invention is to provide such a protection which is easy to implement.

An embodiment of the present invention provides using, in case of an overvoltage, MOS power transistors, existing in the output amplification stages of the integrated circuit, as an overvoltage removal path.

Thus, an embodiment of the present invention provides an integrated circuit protected against electrostatic discharges, having output pads coupled to amplification stages, each stage comprising, between first and second power supply rails, a P-channel MOS power transistor in series with an N-channel MOS power transistor, this integrated circuit further comprising protection means for simultaneously turning on the two transistors when a positive overvoltage occurs between the first and second power supply rails.

According to an embodiment of the present invention, in each amplification stage, the sources of the P- and N-channel transistors are respectively connected to the first and second power supply rails, and the drains of the transistors are connected to the output pad.

According to an embodiment of the present invention, the integrated circuit comprises a control circuit for each amplification stage to control, in normal operation, the turning off and the turning on of the transistors, this control circuit comprising at least one output connected to the gates of the P-channel and N-channel transistors, and the protection means comprise: first and second resistors respectively connected between the output of the control circuit and the respective gates of the P-channel and N-channel transistors; and a detection and trigger circuit comprising first and second outputs respectively connected to the gates of the P-channel and N-channel transistors, capable of simultaneously turning on the two transistors when a positive overvoltage occurs between the first and second power supply rails.

According to an embodiment of the present invention, the amplification stage control circuit is connected to the first and second power supply rails via P-channel and N-channel MOS transistors, having their respective gates connected to edge detectors capable of controlling the turning off of these transistors when a positive overvoltage occurs between the first and second power supply rails.

According to an embodiment of the present invention, the detection and trigger circuit comprises: a first zener diode forward-connected between its second output and the first rail; and a second zener diode forward-connected between the second rail and its first output.

According to an embodiment of the present invention, the detection and trigger circuit comprises: a first edge detector comprising a resistor in series with a capacitor, connected between the first and second rails; a second edge detector comprising a resistor in series with a capacitor, connected between the second and first rails; a P-channel MOS transistor having its source and its drain respectively connected to the first rail and to the first output, and having its gate connected between the resistor and the capacitor of the first edge detector; an N-channel MOS transistor having its source and its drain respectively connected to the second rail and to the second output, and having its gate connected between the resistor and the capacitor of the second edge detector; and first and second zener diodes respectively forward-connected between the second rail and the gate of the P-channel transistor, and between the gate of the N-channel transistor and the first rail.

The foregoing objects, features, and advantages of the present invention will be discussed in detail in the following non-limiting description of specific embodiments in connection with the accompanying drawings.

DETAILED DESCRIPTION

Figure 1:
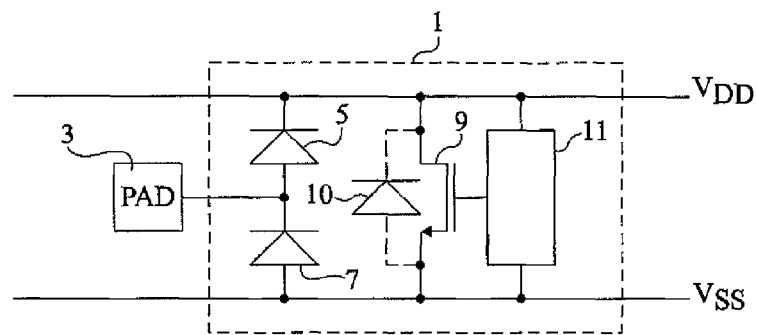
FIG. 1, previously described, shows an example of a structure of protection against overvoltages associated with a pad of an integrated circuit.

For clarity, the same elements have been designated with the same reference numerals in the different drawings.

In an integrated circuit, an output amplification stage is associated with each output pad, to adapt the (low) power of the internal signals of the circuit, to a (higher) level exploitable outside of the circuit.

Figure 3:
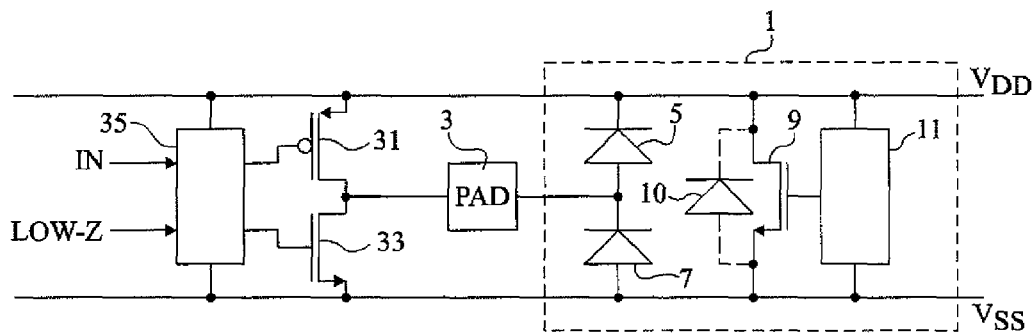
FIG. 3 shows the diagram of FIG. 1, and further shows an amplification stage, associated with an output pad of an integrated circuit.

FIG. 3 shows the diagram of FIG. 1 of a protection structure associated with a pad 3 of an integrated circuit, in the case where this pad is an output pad. In this case, an output amplification stage is associated with pad 3.

The output amplification stage comprises a P-channel MOS power transistor 31, in series with an N-channel MOS power transistor 33. The sources of transistors 31 and 33 are respectively connected to high and low power supply rails $V_{DD}$ and $V_{SS}$. The drains of transistors 31 and 33 are interconnected at a node connected to output pad 3 of the circuit. A control circuit 35 of the amplification stage is provided to control the gates of transistors 31 and 33. In this example, circuit 35 comprises two inputs IN and LOW-Z, and two outputs, respectively connected to the gates of transistors 31 and 33, to control the flowing of the current in one or the other of transistors 31 and 33 according to the state of inputs IN and LOW-Z. Signal IN corresponds to the signal which should be amplified by the amplification stage. Signal LOW-Z controls the setting of the output pad to high impedance, that is, the simultaneous turning off of transistors 31 and 33. For its power supply, circuit 35 is connected to rails $V_{DD}$ and $V_{SS}$.

Figure 4:
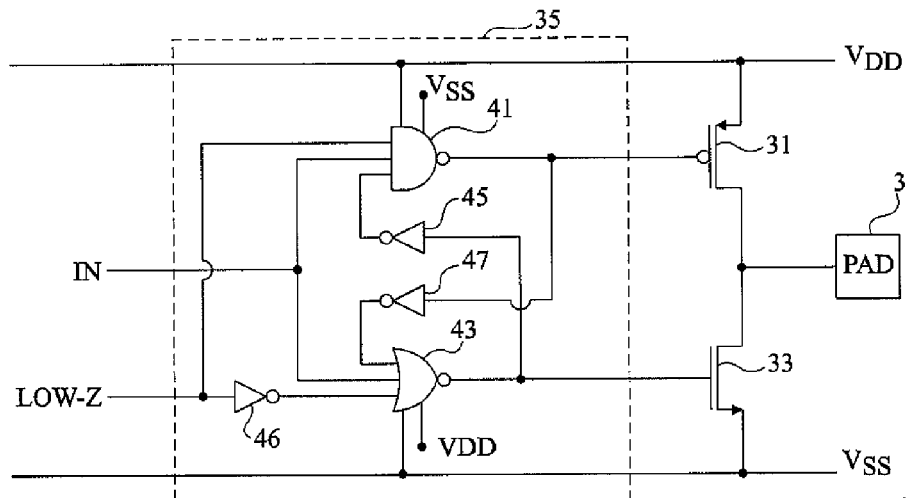
FIG. 4 partly shows the diagram of FIG. 3 and shows in further detail a possible embodiment of an output amplification stage of an integrated circuit.

FIG. 4 shows in further detail a possible embodiment of circuit 35 for controlling output amplification stage 31, 33. Circuit 35 comprises a three-input NAND gate 41 and a three-input NOR gate 43. The outputs of NAND gate 41 and NOR gate 43 are respectively connected to the gates of transistors 31 and 33. NAND gate 41 receives signal IN, signal LOW-Z, and the output signal of NOR gate 43 inverted by an inverter 45. NOR gate 43 receives signal IN, signal LOW-Z inverted by an inverter 46, and the output signal of NAND gate 41 inverted by an inverter 47. For their power supply, logic gates 41, 43, 45, 46, and 47 are connected to power supply rails $V_{DD}$ and $V_{SS}$.

When signal LOW-Z is in a low state, to set output pad 3 to high impedance, the gate nodes of transistors 31 and 33 are respectively in high and low states. Thus, transistors 31 and 33 are both off, and pad 3 is at high impedance.

When signal LOW-Z is in a low state, the state of the gate nodes of transistors 31 and 33 is determined by signal IN.

Control circuit 35 is provided to control the turning-on of one or the other of transistors 31 and 33 (amplification of input signal IN) or the simultaneous turning-off of transistors 31 and 33 (setting to high impedance of the output pad), but never the simultaneous turning-on of two transistors, which would short-circuit the integrated circuit power supply. The return of the output signal of NAND gate 41 to the input of NOR gate 43, via inverter 47, and the return of the output signal of NOR gate 43 to the input of NAND gate 41, via inverter 45, enable to ascertain that power transistors 31 and 33 are not simultaneously on, even for a short time, for example, in switchings of signal IN.

It is here provided to use the MOS power transistors of the output amplification stage of an integrated circuit as an electrostatic discharge removal path. It is especially provided, in case of a positive overvoltage between power supply rails $V_{DD}$ and $V_{SS}$, to simultaneously turn on transistors 31 and 33 to enable to remove the overvoltage.

Figure 5:
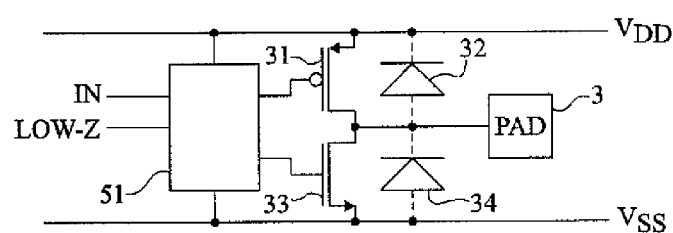
FIG. 5 shows a structure of protection against overvoltages using, as a protection element, the transistors of an output amplification stage of an integrated circuit.

FIG. 5 schematically shows an embodiment of a protection structure associated with an output pad of an integrated circuit, using the transistors of the output amplification stage associated with the pad as elements of protection against electrostatic discharges.

A control circuit 51, connected between power supply rails $V_{DD}$ and $V_{SS}$, is provided to control the gates of transistors 31 and 33 of the output amplification stage associated with pad 3. Parasitic diodes 32 and 34 of transistors 31 and 33 have been shown in the drawing. Diodes 32 and 34 are respectively forward-connected between pad 3 and rail $V_{DD}$ and reverse-connected between pad 3 and rail $V_{SS}$. Like control circuit 35 described in relation with FIGS. 3 and 4, circuit 51 comprises two inputs IN and LOW-Z, and two outputs, respectively connected to the gates of transistors 31 and 33, to control the flowing of the current in one or the other of the transistors according to the state of inputs IN and LOW-Z. Circuit 51 further comprises protection means for controlling the simultaneous turning-on of transistors 31 and 33 in case of a positive overvoltage between rails $V_{DD}$ and $V_{SS}$.

In case of a positive overvoltage between rails $V_{DD}$ and $V_{SS}$, circuit 51 controls the turning-on of transistors 31 and 33, which enables to remove the overvoltage.

In case of a negative overvoltage between rails $V_{DD}$ and $V_{SS}$, diodes 34 and 32 become conductive and the overvoltage is removed.

In case of a positive overvoltage between pad 3 and high power supply rail $V_{DD}$, diode 32 becomes conductive and the overvoltage is removed.

In case of a negative overvoltage between pad 3 and rail $V_{DD}$, circuit 51 controls the turning-on of transistors 31 and 33 and the overvoltage is removed through transistor 31.

In case of a positive overvoltage between pad 3 and rail $V_{SS}$, diode 32 becomes conductive and the positive overvoltage is transferred onto rail $V_{DD}$. Circuit 51 controls the turning-on of transistors 31 and 33 and the overvoltage is removed through transistor 33.

In case of a negative overvoltage between pad 3 and rail $V_{SS}$, diode 34 becomes conductive and the overvoltage is removed.

In case of a positive or negative overvoltage between two input/output pads 3, diode 32 associated with the most positive pad becomes conductive. Circuit 51 then controls the turning-on of transistors 31 and 33, and the overvoltage is removed via transistor 33 associated with the most positive pad and via diode 34 associated with the least positive pad and, in parallel, via diode 32 associated with the most positive pad and via transistor 31 associated with the least positive pad.

Figure 2:
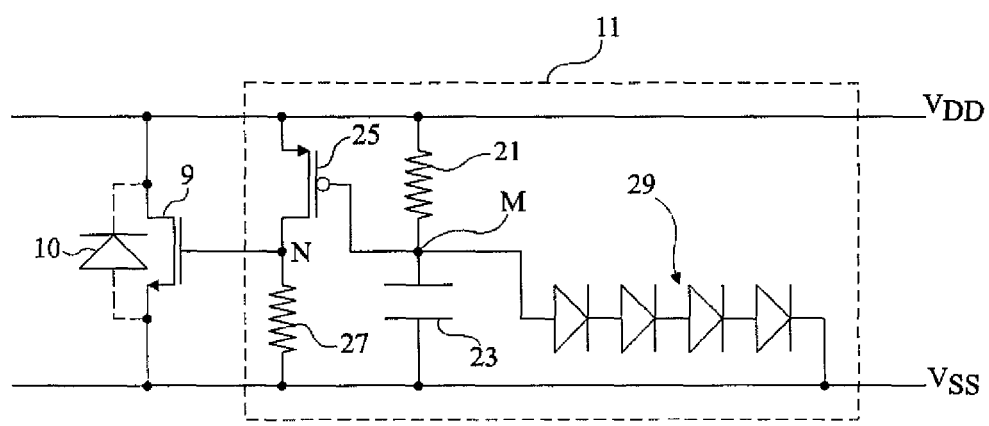
FIG. 2, previously described, partly shows the diagram of FIG. 1, and shows in further detail a possible embodiment of a detector of a positive overvoltage between the power supply rails of the integrated circuit.
Figure 6:
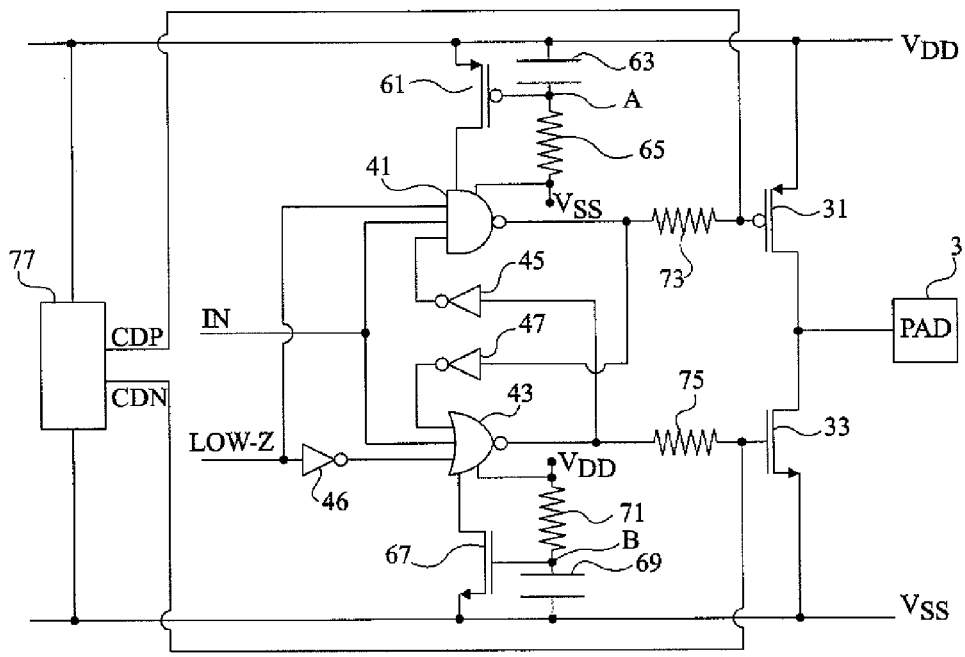
FIG. 6 shows in further detail an embodiment of the protection structure of FIG. 5.

Thus, transistors 31 and 33 enable removing any type of overvoltage capable of occurring between two (output) pads or rails of the circuit. Due to their normal power amplification function, transistors 31 and 33 have significant dimensions, and can advantageously replace the protection elements of conventional structures of the type described in relation with FIGS. 1 and 2 (transistor 9 and diodes 5 and 7). It should be noted that, to provide a full protection of the circuit, it may be provided to associate a protection adapted to the input pads of the circuit, for example, diodes of the type of diodes 5 and 7 of FIG. 1, capable of transferring onto their power supply rails the overvoltages likely to occur on the input pads. The overvoltages can then be removed via the output stages of the output pads. FIG. 6 shows the diagram of FIG. 5, and shows in further detail an embodiment of the circuit for controlling the transistors of the output amplification stage (circuit 51 of FIG. 5).

Like circuit 35 described in relation with FIG. 4 the circuit of FIG. 6 comprises a logic block comprising a NAND gate 41, a NOR gate 43, and inverters 45, 46, and 47, to control, in normal operation, the gates of transistors 31 and 33 according to the state of input signals IN and LOW-Z.

Resistors 73 and 75 are respectively added between the output of NAND gate 41 and the gate of transistor 31 and between the output of NOR gate 43 and the gate of transistor 33.

Further, a detection and trigger circuit 77 is connected between power supply rails $V_{DD}$ and $V_{SS}$. Circuit 77 comprises outputs CDP and CDN, respectively connected to the gates of transistors 31 and 33.

An edge detector, formed of a capacitor 63 in series with a resistor 65, is connected between rails $V_{DD}$ and $V_{SS}$. NAND gate 41 is connected to power supply rail $V_{DD}$ via a P-channel MOS transistor 61 having its gate connected to node A between capacitance 63 and resistor 65. The source and the drain of transistor 61 are respectively connected to rail $V_{DD}$ and to the high power supply terminal of NAND gate 41. The low power supply terminal of NAND gate 41 is connected to rail $V_{SS}$.

Similarly, the power supply of NOR gate 43 is coupled with an edge detector, formed of a capacitor 69 in series with a resistor 71, connected between rails $V_{SS}$ and $V_{DD}$. NOR gate 43 is connected to power supply rail $V_{SS}$ via an N-channel MOS transistor 67 having its gate connected to a node B between capacitor 69 and resistor 71. The source and the drain of transistor 67 are respectively connected to rail $V_{SS}$ and to the low power supply terminal of NOR gate 43. The high power supply terminal of NOR gate 43 is connected to rail $V_{DD}$.

In normal operation, signals CDP and CDN are at high impedance and do not disturb the operation of the amplification stage control circuit. Further, nodes A and B respectively are in low and high states, maintaining transistors 61 and 67 on. Thus, the circuit for controlling the amplification stage is powered normally.

In case of a positive overvoltage between rails $V_{DD}$ and $V_{SS}$, signals CDP and CDN respectively switch to low and high states. Thus, due to the presence of resistors 73 and 75, whatever the output state of NAND gate 41 and NOR gate 43, the voltage on the gate of P-channel MOS transistor 31 is smaller than the voltage of rail $V_{DD}$, and the voltage on the gate of N-channel MOS transistor 33 is greater than the voltage of rail $V_{SS}$. This causes the simultaneous turning-on of transistors 31 and 33 and the removal of the overvoltage.

The coupling of the power supplies of NAND gate 41 and NOR gate 43 with edge detectors is an additional way of ascertain the turning-on of transistors 31 and 33, when a fast positive overvoltage occurs between rails $V_{DD}$ and $V_{SS}$, while the integrated circuit is not powered. When the integrated circuit is not powered, node A between resistor 65 and capacitor 63 is in a low state. When a fast overvoltage occurs between rails $V_{DD}$ and $V_{SS}$, node A immediately switches to a high state, that is, substantially to the same voltage as rail $V_{DD}$, which causes the turning-off of transistor 61. Thus, despite the presence of a positive voltage between rails $V_{DD}$ and $V_{SS}$, NAND gate 41 is not powered and its output remains floating, in an undetermined state. Output signal CDP of circuit 77 can thus freely control the turning-on of transistor 31 to enable to remove the overvoltage. A substantially symmetrical line of argument applies to NOR gate 43 and to transistor 33.

Figure 7:
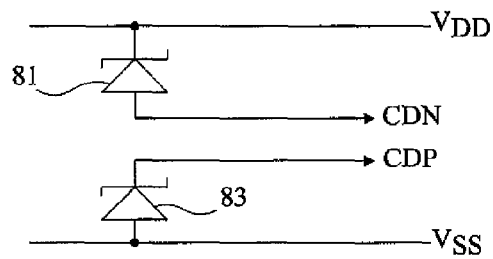
FIG. 7 shows an embodiment of a detection and trigger circuit associated with a protection structure of the type described in relation with FIG. 6.

FIG. 7 shows an embodiment of detection and trigger circuit 77 of the protection structure of FIG. 6. This circuit comprises zener diodes 81 and 83, respectively forward-connected between output CDN of the circuit and rail $V_{DD}$, and reverse-connected between output CDP of the circuit and rail $V_{SS}$.

In normal operation, when the circuit is powered, diodes 81 and 83 are non-conductive, and outputs CDN and CDP of the circuit are at high impedance.

When the potential difference between rails $V_{DD}$ and $V_{SS}$ exceeds a given threshold, diodes 81 and 83 become conductive in reverse mode, by avalanche effect. Thus, output CDN switches to a high state, that is, substantially at the same voltage as rail $V_{DD}$ minus a value $V_Z$ corresponding to the threshold voltage of diode 81. Further, output CDP switches to a low state, that is, substantially to voltage $V_Z$ corresponding to the threshold voltage of diode 83.

Figure 8:
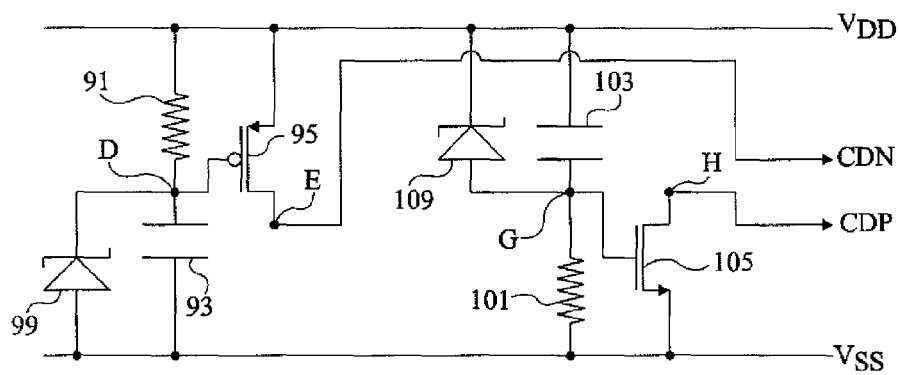
FIG. 8 shows another embodiment of a detection and trigger circuit associated with a protection structure of the type described in relation with FIG. 6.

FIG. 8 shows a preferred alternative embodiment of detection and trigger circuit 77 of the protection structure of FIG. 6. An edge detector, formed of a resistor 91 in series with a capacitor 93, is connected between power supply rails $V_{DD}$ and $V_{SS}$. Node D between resistor 91 and capacitor 93 is connected to the gate of a P-channel MOS transistor 95 having its source connected to rail $V_{DD}$ and having its drain node E connected to output CDN of the circuit. A zener diode 99 is forward-connected between rail $V_{SS}$ and node D. Another edge detector, formed of a resistor 101 in series with a capacitor 103, is connected between power supply rails $V_{SS}$ and $V_{DD}$. Node G between resistor 101 and capacitor 103 is connected to the gate of an N-channel MOS transistor 105 having its source connected to rail $V_{SS}$ and having its drain node H connected to output CDP of the circuit. A zener diode 109 is reverse connected between rail $V_{DD}$ and node G.

In normal operation, when the circuit is powered, nodes D and G are respectively at high and low voltages, and transistors 95 and 105 are thus off. Thus, outputs CDN and CDP of the circuit are at high impedance.

When the potential difference between rails $V_{DD}$ and $V_{SS}$ exceeds a given threshold, diodes 99 and 109 become conductive in reverse mode by avalanche effect. This results in limiting the voltage of node D and causes a rise of the voltage at node G. Transistors 95 and 105 thus turn on. Thus, outputs CDN and CDP of the circuit respectively switch to high and low states, that is, substantially to the voltages of rails $V_{DD}$ and $V_{SS}$.

When the integrated circuit is not powered, nodes D and G are at low states. If a fast positive overvoltage occurs between rails $V_{DD}$ and $V_{SS}$, node D remains in a low state, and node G rapidly switches to a high state, substantially corresponding to the voltage of rail $V_{DD}$. Transistors 95 and 105 thus turn on and outputs CDN and CDP respectively switch to high and low states.

An advantage of the detection and trigger circuit of FIG. 8 over the circuit of FIG. 7 is that in the circuit of FIG. 8, in case of an overvoltage, outputs CDP and CDN are at voltages which are respectively lower and higher than in the case of the circuit of FIG. 7. This results in a better conduction of transistors 31 and 33 and thus in a better efficiency of the protection.

Figure 9:
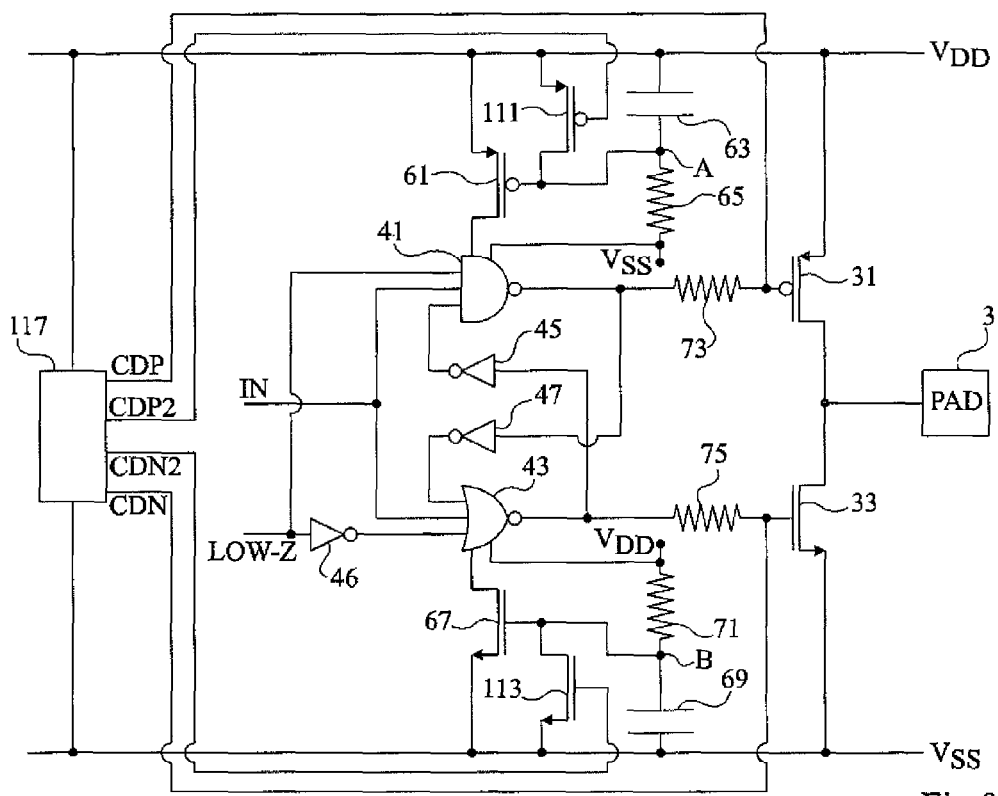
FIG. 9 shows an alternative embodiment of a protection structure of the type described in relation with FIGS. 5 and 6.

FIG. 9 shows another alternative embodiment of the protection structure of FIG. 5. The circuit of FIG. 9 is similar by many points to the circuit of FIG. 6, and the features which are not necessary to highlight the advantages of this circuit will not be described again hereafter.

In the circuit of FIG. 9, detection and trigger circuit 77 of FIG. 6 is replaced with a detection and trigger circuit 117 comprising, in addition to outputs CDP and CDN respectively connected to the gates of transistors 31 and 33, outputs CDP2 and CDN2.

As in the circuit of FIG. 6, NAND gate 41 is connected to power supply rail $V_{DD}$ via a P-channel MOS transistor 61. An edge detector comprising a capacitor 63 in series with a resistor 65 is connected between rails $V_{DD}$ and $V_{SS}$. The node between capacitor 63 and resistor 65 is connected to the gate of transistor 61. Similarly, NOR gate 43 is connected to power supply rail $V_{SS}$ via an N-channel MOS transistor 67. Another edge detector comprising a capacitor 69 in series with a resistor 71 is connected between rails $V_{SS}$ and $V_{DD}$. The node between capacitor 69 and resistor 71 is connected to the gate of transistor 67.

The circuit of FIG. 9 further comprises a P-channel MOS transistor 111 having its source connected to rail $V_{DD}$ and having its drain connected to the gate of transistor 61. The gate of transistor 111 is connected to output CDP2 of detection and trigger circuit 117. The circuit of FIG. 9 also comprises an N-channel MOS transistor 113 having its source connected to rail $V_{SS}$ and having its drain connected to the gate of transistor 67. The gate of transistor 113 is connected to output CDN2 of circuit 117.

In normal operation, signals CDP and CDN are at high impedance, and signals CDP2 and CDN2 respectively are at high and low states, maintaining transistors 111 and 113 off. Nodes A and B respectively are at low and high states, maintaining transistors 61 and 67 on. Thus, the amplification stage control circuit is powered and, due to the high impedance of outputs CDP and CDN, its normal operation is not disturbed.

In case of a positive overvoltage between rails $V_{DD}$ and $V_{SS}$, signals CDP and CDN respectively switch to low and high states, which causes the simultaneous turning-on of transistors 31 and 33 and the removal of the overvoltage.

As in the circuit of FIG. 6, the coupling of the power supplies of NAND gate 41 and NOR gate 43 with edge detectors is an additional way of ascertaining the turning-on of transistors 31 and 33 when a fast positive overvoltage occurs between rails $V_{DD}$ and $V_{SS}$ while the integrated circuit is not powered.

The provision of transistors 111 and 113 also enables to ascertain the cutting-off of the power supply of gates 41 and 43 when a slow positive overvoltage occurs between rails $V_{DD}$ and $V_{SS}$. When a positive overvoltage occurs between rails $V_{DD}$ and $V_{SS}$, outputs CDP2 and CDN2 of circuit 117 respectively switch to low and high states, which turns on transistors 111 and 113. This results in a rise of the gate voltage of transistor 61 and a drop of the gate voltage of transistor 67, which turns off transistors 61 and 67. NAND gate 41 and NOR gate 43 are thus not powered and their respective outputs are floating, at undetermined states. Detection and trigger circuit 117 can thus freely control the turning-on of protection transistors 31 and 33 via its outputs CDP and CDN.

Figure 10:
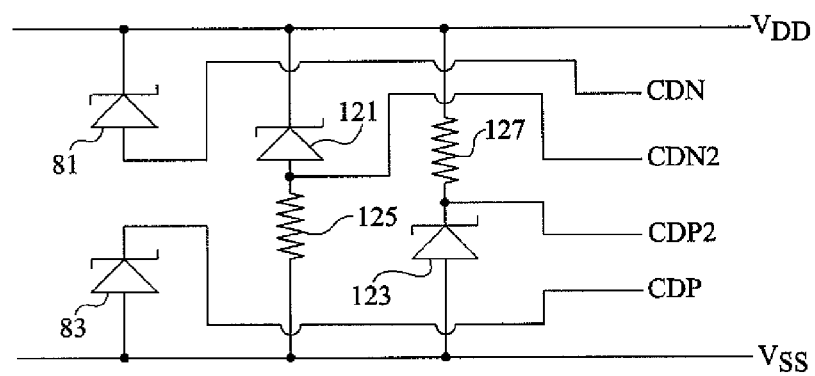
FIG. 10 shows an embodiment of a detection and trigger circuit associated with a protection structure of the type described in relation with FIG. 9.

FIG. 10 shows an embodiment of detection and trigger circuit 117 of the protection structure of FIG. 9. The circuit of FIG. 10 comprises all the elements of the circuit of FIG. 7 and further comprises zener diodes 121 and 123 respectively forward-connected between output CDN2 and rail $V_{DD}$, and reverse-connected between output CDP2 of the circuit and rail $V_{SS}$, as well as resistors 125 and 127 respectively connected between output CDN2 and rail $V_{SS}$ and between output CDP2 and rail $V_{DD}$.

In normal operation, when the circuit is powered, diodes 81, 83, 121, and 123 are non-conductive. Thus, outputs CDN and CDP are at high impedance and outputs CDN2 and CDP2 respectively are at low and high states.

When the voltage difference between rails $V_{DD}$ and $V_{SS}$ exceeds a given threshold, diodes 81, 83, 121, and 123 become conductive in reverse mode, by avalanche effect. Thus, outputs CDN and CDN2 switch to a high state, that is, substantially to the same voltage as rail $V_{DD}$ minus a value $V_Z$ corresponding to the threshold voltage of the diodes. Further, outputs CDP and CDP2 switch to a low state, that is, substantially to voltage $V_Z$ corresponding to the threshold voltage of the diodes.

Figure 11:
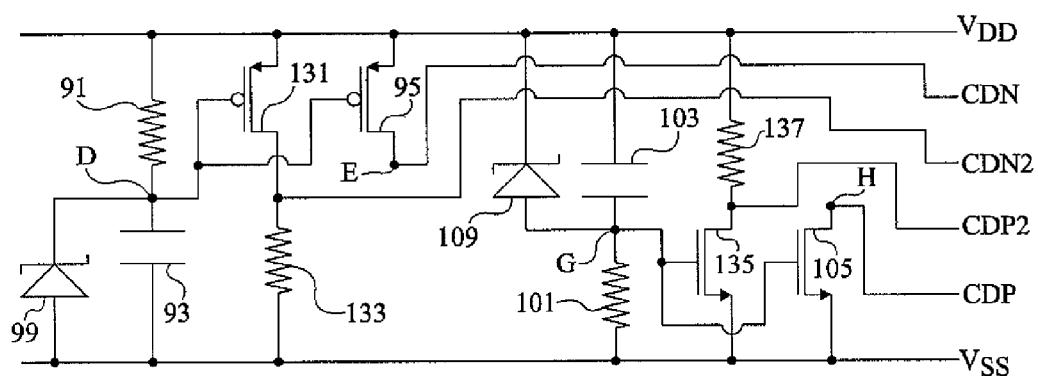
FIG. 11 shows another embodiment of a detection and trigger circuit associated with a protection structure of the type described in relation with FIG. 9.

FIG. 11 shows a preferred alternative embodiment of detection and trigger circuit 117 of the protection structure of FIG. 9. The circuit of FIG. 11 shows all the elements of the circuit of FIG. 8. Only the additional elements will be described herein. Node D is connected to the gate of a P-channel MOS transistor 131 having its source connected to rail $V_{DD}$ and having its drain node connected to output CDN2 of the circuit. A resistor 133 is connected between output CDN2 and rail $V_{SS}$. Further, node G is connected to the gate of an N-channel MOS transistor 135 having its source connected to rail $V_{SS}$ and having its drain node connected to output CDP2 of the circuit. A resistor 137 is connected between output CDP2 and rail $V_{DD}$.

In normal operation, when the circuit is powered, nodes D and G are respectively at high and low voltages, maintaining transistors 95, 131, 105, and 135 off. Thus, outputs CDN and CDP of the circuit are at high impedance and outputs CDN2 and CDP2 respectively are at low and high states.

When the potential difference between rails $V_{DD}$ and $V_{SS}$ exceeds a given threshold, diodes 99 and 109 become conductive in reverse mode, by avalanche effect. This limits the voltage of node D and causes a rise of the voltage at node G. Transistors 95, 131, 105, and 135 thus become conductive. Thus, outputs CDN and CDN2 switch to a high state, that is, substantially to the voltage of rail $V_{DD}$, and outputs CDP and CDP2 switch to a low state, that is, substantially to the voltage of rail $V_{SS}$.

When the integrated circuit is not powered, nodes D and G are at low states. If a fast positive overvoltage occurs between rails $V_{DD}$ and $V_{SS}$, node D remains in a low state, and node G rapidly rises to a high state, substantially corresponding to the voltage of rail $V_{DD}$. Transistors 95, 131, 105, and 135 thus turn on. Outputs CDN and CDN2 switch to a high state and outputs CDP and CDP2 switch to a low state.

An advantage of the provided embodiments is that they enable, in an integrated circuit, to decrease the silicon surface area specifically dedicated to the protection against electrostatic discharges.

Eliminating the MOS transistors specifically dedicated to the protection enables to decrease the electric overconsumption linked to leakage currents through these transistors.

Specific embodiments of the present invention have been described. Different variations and modifications will occur to those skilled in the art. In particular, embodiments of detection and trigger circuits have been described in relation with FIGS. 7 and 8. The present invention is not limited to these specific cases. It will be within the abilities of those skilled in the art to use any other circuit capable of detecting positive overvoltages between rails $V_{DD}$ and $V_{SS}$ and to accordingly control the gates of the transistors of the output amplification stage.

Further, the present invention is not limited to the use of the circuit described in relation with FIG. 4, to control, in normal operation, the turning-off and the turning-on of the MOS transistors of the output amplification stage.

Similarly, other logic blocks than those described in relation with FIGS. 6 and 9 may be provided to interrupt, in case of an overvoltage, the normal power supply of the circuit for controlling the transistors of the output amplification stage.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit protected against electrostatic discharges, having output pads coupled to amplification stages, each stage comprising, between first and second power supply rails, a P-channel MOS power transistor in series with an N-channel MOS power transistor, this integrated circuit further comprising protection means for simultaneously turning-on the two transistors when a positive overvoltage occurs between the first and second power supply rails, said protection means comprising a detection and trigger circuit comprising:

a first edge detector comprising a resistor in series with a capacitor, connected between the first and second rails;
a second edge detector comprising a resistor in series with a capacitor, connected between the second and first rails;
a P-channel MOS transistor having its source and its drain respectively connected to the first rail and to a first output, and having its gate connected between the resistor and the capacitor of the first edge detector;
an N-channel MOS transistor having its source and its drain respectively connected to a second rail and to a second output, and having its gate connected between the resistor and the capacitor of the second edge detector; and first and second zener diodes respectively forward-connected between the second rail and the gate of the P-channel transistor, and between the gate of the N-channel transistor and the first rail.

2. The integrated circuit of claim 1, wherein in each amplification stage, the sources of the P-channel and N-channel power transistors are respectively connected to the first and second power supply rails, and the drains of the power transistors are connected to the output pad.

3. The integrated circuit of claim 1, comprising a control circuit for each amplification stage to control, in normal operation, the turning-off and the turning-on of the power transistors, this control circuit comprising at least one output connected to the gates of the power transistors, and wherein said protection means comprise:

first and second resistors respectively connected between said at least one output of the control circuit and the respective gates of the P-channel and N-channel power transistors.

4. The integrated circuit of claim 3, wherein the amplification stage control circuit is connected to the first and second power supply rails via P-channel and N-channel MOS transistors, having their respective gates connected to edge detectors capable of controlling the turning off of these transistors when a positive overvoltage occurs between the first and second power supply rails.

* * * * *

UNITED STATES PATENT AND TRADEMARK OFFICE
CERTIFICATE OF CORRECTION

PATENT NO.       : 8,405,942 B2
APPLICATION NO.  : 13/021904
DATED            : March 26, 2013
INVENTOR(S)      : François Tailliet Page 1 of 1

It is certified that error appears in the above-identified patent and that said Letters Patent is hereby corrected as shown below:

In the Claims

Col. 10, line 64, claim 1, should read:
drain respectively connected to the second rail Signed and Sealed this
Twenty-eighth Day of May, 2013

Teresa Stanek Rea
*Acting Director of the United States Patent and Trademark Office*